(12) United States Patent
Saito et al.

(10) Patent No.: US 8,652,942 B2
(45) Date of Patent: Feb. 18, 2014

(54) METHOD FOR MANUFACTURING ELECTRONIC PARTS

(75) Inventors: Takeshi Saito, Shibukawa (JP); Tomomichi Takatsu, Shibukawa (JP)

(73) Assignee: Denki Kagaku Kogyo Kabushiki Kaisha, Tokyo (JP)

( * ) Notice: Subject to any disclaimer, the term of this patent is extended or adjusted under 35 U.S.C. 154(b) by 0 days.

(21) Appl. No.: 13/825,673

(22) PCT Filed: Sep. 14, 2011

(86) PCT No.: PCT/JP2011/070964
§ 371 (c)(1),
(2), (4) Date: Mar. 22, 2013

(87) PCT Pub. No.: WO2012/049939
PCT Pub. Date: Apr. 9, 2012

(65) Prior Publication Data
US 2013/0183812 A1    Jul. 18, 2013

(30) Foreign Application Priority Data
Oct. 14, 2010    (JP) .................................. 2010-231136

(51) Int. Cl.
*H01L 21/00*    (2006.01)

(52) U.S. Cl.
USPC ............................ 438/464; 438/460; 525/100

(58) Field of Classification Search
USPC ........................... 438/460, 464; 525/100, 101
See application file for complete search history.

(56) References Cited

U.S. PATENT DOCUMENTS

| | | |
|---|---|---|
| 2006/0188725 A1 | 8/2006 | Yoshida et al. |
| 2006/0204749 A1 | 9/2006 | Kita et al. |
| 2010/0248452 A1* | 9/2010 | Saito et al. .................... 438/464 |

FOREIGN PATENT DOCUMENTS

| | | |
|---|---|---|
| JP | 2006-049509 A | 2/2006 |
| JP | 2006-264296 A | 10/2006 |
| JP | 2007-246633 A | 9/2007 |
| JP | 2008-1817 A | 1/2008 |
| JP | 2009-141009 A | 6/2009 |
| JP | 2010-219293 A | 9/2010 |
| WO | 2010-047272 A1 | 4/2010 |

OTHER PUBLICATIONS

International Search Report of PCT/JP2011/070964 mailed on Nov. 22, 2011.
U.S. Appl. No. 13/820,871, filed Mar. 5, 2013.

* cited by examiner

*Primary Examiner* — Bradley K Smith
(74) *Attorney, Agent, or Firm* — Roberts Mlotkowski Safran & Cole P.C.

(57) ABSTRACT

A method for manufacturing electronic parts, which is characteristic in that it permits reduction of contamination to the semi-cured adhesive layer formed on semiconductor wafer and the cohesive sheet used therein is superior in adhesiveness for example to the lead frame, the method comprising a semi-cured adhesive layer-forming step of forming a semi-cured adhesive layer by coating a pasty adhesive entirely over the rear face of a wafer and curing the pasty adhesive partially by radiation-ray irradiation or heating into the sheet shape, a fixing step of fixing the semi-cured adhesive layer formed on a wafer and a ring frame by bonding them to the cohesive layer of a cohesive sheet, a dicing step of dicing the wafer together with the semi-cured adhesive layer with a dicing blade into semiconductor chips, and a pick-up step of picking up the chips carrying the semi-cured adhesive layer from the cohesive layer of the cohesive sheet after radiation-ray irradiation, wherein the photopolymerization initiator in the cohesive layer of the cohesive sheet has a particular property.

5 Claims, No Drawings

METHOD FOR MANUFACTURING ELECTRONIC PARTS

TECHNICAL FIELD

The present invention relates to a method for manufacturing electronic parts, comprising dicing a wafer using a cohesive sheet.

BACKGROUND ART

Known as a method for manufacturing electronic parts is a manufacturing method comprising a bonding step of bonding electronic component composites carrying multiple circuit patterns formed on a wafer or an insulating substrate onto a cohesive sheet, a dicing step of dicing the electronic component composites with a dicing blade into semiconductor chips, a pick-up step of picking up the cut chips from the cohesive sheet after reduction of the adhesive power between the cohesive sheet and the electronic component composites by irradiation with UV ray from the cohesive sheet side, and a fixing step of applying an adhesive agent on the bottom face of the picked-up chips and fixing the chips for example on a lead frame with the adhesive agent.

In such production methods, proposed was a method of using a multilayer cohesive sheet having both a function as a cohesive sheet for dicing and a function as an adhesive for fixing the chips for example onto a lead frame (integrated cohesive layer/die attach film sheet), which is prepared by integrating the cohesive sheet with a cohesive layer or a die attach film by lamination (Patent Documents 1 and 2).

On the other hand, also known is a method of coating a pasty adhesive on a semiconductor wafer, partially curing the pasty adhesive by radiation-ray irradiation or heating into a semi-cured adhesive layer in the sheet shape, bonding it to a cohesive sheet, dicing the wafer, and thus obtaining chips carrying the semi-cured adhesive layer fixed thereon.

The method is advantageous in that it is possible, by using a multilayer cohesive sheet or a semiconductor wafer carrying a semi-cured adhesive layer previously formed, to eliminate the coating step of coating an adhesive after dicing and it is also easy to control the thickness of the adhesive region and suppress protrusion of the adhesive region.

PRIOR ART LITERATURE

Patent Documents

[Patent Document 1] JP-A No. 2006-049509
[Patent Document 2] JP-A No. 2007-246633

SUMMARY OF THE INVENTION

Technical Problem

However, when the method of forming a semi-cured adhesive layer on a semiconductor wafer and fixing it by bonding it to the cohesive layer of a cohesive sheet is used, the photopolymerization initiator, a low-molecular-weight component contained in the cohesive constituting the cohesive layer, often migrates into the semi-cured adhesive layer, causing adhesion failure for example with the lead frame. More specifically, when the chips carrying the semi-cured adhesive layer obtained after the dicing and pick-up steps are bonded to a lead frame, molded with a sealing resin and heated at around 260° C., there was separation generated between the lead frame and the semi-cured adhesive layer, consequently leading to decrease of the yield in the semiconductor manufacturing process.

In the present invention which was made under the circumstances above, the inventors have found that it is possible, by using a cohesive constituting the cohesive layer of cohesive sheet having a particular composition, to reduce contamination to the semi-cured adhesive layer formed on the semiconductor wafer and thus improve the adhesiveness of the chips for example to the lead frame and made the present invention.

Solution to Problem

Accordingly, the present invention relates to the following method for manufacturing electronic parts:

(1) a method for manufacturing electronic parts, comprising a semi-cured adhesive layer-forming step of forming a semi-cured adhesive layer by coating a pasty adhesive entirely over the rear face (i.e. the face not carrying circuits) of a wafer and curing the pasty adhesive partially by radiation-ray irradiation or heating into the sheet shape, a fixing step of fixing the semi-cured adhesive layer formed on a wafer and a ring frame by bonding them to the cohesive layer of a cohesive sheet, a dicing step of dicing the wafer together with the semi-cured adhesive layer with a dicing blade into semiconductor chips, and a pick-up step of picking up the chips carrying the semi-cured adhesive layer from the cohesive layer of the cohesive sheet after radiation-ray irradiation, wherein:

the cohesive sheet has a base film and a cohesive layer laminated on one face of the base film;

the cohesive constituting the cohesive layer contains a (meth)acrylate ester copolymer, an ultraviolet polymerizable compound, a multifunctional isocyanate curing agent, and a photopolymerization initiator; and the temperature of the photopolymerization initiator, at which the weight loss rate thereof, which is calculated by the following equation:

$$\text{weight loss rate} = \{(\text{mass before heating} - \text{mass after heating})/(\text{mass before heating})\} \times 100 (\%)$$

(wherein, the mass before heating is the mass of the photopolymerization initiator at 25° C.; the mass after heating is the mass of the photopolymerization initiator at each temperature when it is heated from 23° C. to 500° C. at a heating rate of 10° C./minute) becomes 10%, is 250° C. or higher;

(2) the method for manufacturing electronic parts according to (1), wherein the photopolymerization initiator is ethanone, 1-[9-ethyl-6-(2-methylbenzoyl)-9H-carbazol-3-yl]-, 1-(O-acetyloxime), 2,4,6-trimethylbenzoyl-diphenyl-phosphine oxide, or 2-hydroxy-1-{4-[4-(2-hydroxy-2-methyl-propionyl)-benzyl]-phenyl}-2-methyl-propan-1-one;

(3) the method for manufacturing electronic parts according to (1) or (2), wherein the cohesive contains a (meth)acrylate ester polymer in an amount of 100 parts by mass, an ultraviolet polymerizable compound in an amount of 5 parts or more by mass and 200 parts or less by mass, a multifunctional isocyanate curing agent in an amount of 0.5 part or more by mass and 20 parts or less by mass, and a photopolymerization initiator in an amount of 0.1 part or more by mass and 20 parts or less by mass; and (4) the method for manufacturing electronic parts according to any one of (1) to (3), wherein the pasty adhesive in the semi-cured adhesive layer-forming step contains at least an epoxy resin and/or a (meth)acrylate ester.

Advantageous Effects of the Invention

According to the method for manufacturing electronic parts of the present invention, wherein the cohesive constituting the cohesive layer of cohesive sheet has a particular composition, it is possible to improve contamination resistance of the semi-cured adhesive layer formed on the semiconductor wafer and thus to suppress adhesion failure for example with the chips and the lead frame.

Also according to the method for manufacturing electronic parts of the present invention, it is possible, in addition to the improvement of contamination resistance above, to reduce the number of chip flying during dicing and to make the cohesive sheet and the semi-cured adhesive layer readily separated from each other.

DESCRIPTION OF EMBODIMENTS

Definition of Terms

The monomer unit, as used herein, means a structural unit derived from monomer. "Part" and "%" are values by mass. (Meth)acrylate is a generic term indicating both acrylate and methacrylate. (Meth)-including compounds such as (meth) acrylic acid are also generic terms indicating both a "meth"- including compound and a "meth"-free compound.

Method for Manufacturing Electronic Parts

The method for manufacturing electronic parts according to the present invention comprises the next steps (1) to (4):
(1) a semi-cured adhesive layer-forming step of forming a semi-cured adhesive layer by coating a pasty adhesive entirely over the rear face of a wafer and curing the pasty adhesive partially by radiation-ray irradiation or heating into the sheet shape;
(2) a fixing step of fixing the semi-cured adhesive layer formed on a wafer and a ring frame by bonding them to the cohesive layer of a cohesive sheet,
(3) a dicing step of dicing the wafer and the semi-cured adhesive layer simultaneously with a dicing blade into semiconductor chips, and
(4) a pick-up step of picking up the chips carrying the semi-cured adhesive layer from the cohesive layer of the cohesive sheet after radiation-ray irradiation.
Hereinafter, each step will be described.

(1) Semi-Cured Adhesive Layer-Forming Step

The semi-cured adhesive layer can be formed typically by applying a pasty adhesive entirely over the rear face of a wafer, i.e. on the circuit-free face is to be bonded to the lead frame or the circuit board and curing it into a sheet shape by radiation-ray irradiation or heating.

The pasty adhesive constituting the semi-cured adhesive layer preferably contains a (meth)acrylate ester, polyamide, polyethylene, polysulfone, an epoxy resin, polyimide, polyamide acid, a silicone resin, a phenol resin, rubber, a fluorine rubber, a fluoroplastic or the mixture or copolymer thereof. It preferably contains an epoxy resin and/or a (meth)acrylate ester from the point of reliability in adhesiveness with chips. The pasty adhesive may contain additionally photopolymerization initiators, thermal polymerization initiators, antistatic agents, crosslinking agents, crosslinking accelerators, fillers and the like.

The methods of coating a pasty adhesive on the rear face of a wafer include, but are not limited to, gravure coating, comma coating, bar coating, knife coating, roll coating, letterpress printing, intaglio printing, lithographic printing, flexographic printing, offset printing, screen printing, spraying, and spin coating.

The method of forming a semi-cured adhesive layer by curing the pasty adhesive partially into the sheet shaped is radiation-ray irradiation or heating. The radiation ray is not particularly limited in its kind and a known radiation ray can be used. When the semi-cured adhesive layer is formed with ultraviolet ray, the ultraviolet ray source is not particularly limited and any known source may be used. Ultraviolet ray sources include black light, low-pressure mercury lamps, high-pressure mercury lamps, ultrahigh-pressure mercury lamps, metal halide lamps, excimer lamps and the like. The amount of the irradiation with ultraviolet ray is not particularly limited and may be selected appropriately according to the design of the pasty adhesive, but generally, it is preferably 100 mJ/cm$^2$ or more and less than 5000 mJ/cm$^2$. Lower irradiation light amount leads to insufficient curing of the pasty adhesive and decrease of pickup efficiency, while larger irradiation light amount leads to elongation of the time needed for irradiation with ultraviolet ray and thus to decrease of processability.

When the semi-cured adhesive layer is formed by heating, the heating temperature is not particularly limited and can be selected appropriately, based on the design of the pasty adhesive, but generally the heating temperature is preferably 60° C. or higher and lower than 250° C. It is because excessively low heating temperature may lead to insufficient curing of the pasty adhesive and thus to reduced pickup efficiency, while excessively high heating temperature may lead to excessive curing of the pasty adhesive and thus to deterioration of the adhesive strength. The heating time is not also limited particularly and can be selected appropriately, based on the design of the pasty adhesive, but generally, it is preferably 10 seconds or more and less than 30 minutes.

The thickness of the semi-cured adhesive layer is preferably 3 µm or more and 100 µm, particularly preferably 5 µm or more and 20 µm or less.

(2) Fixing Step

The fixing step is a step of fixing the semi-cured adhesive layer formed on a wafer and a ring frame by bonding them to the cohesive layer of cohesive sheet, which can generally be carried out in a tape-mounting device equipped with a roller. The cohesive sheet used in the fixing step comprises a base film and a cohesive layer laminated on one face of the base film.

Base Film

The base film is not particularly limited and can be prepared from a known resin material. Typical examples thereof include polyvinyl chloride, polyethylene terephthalate, ethylene-vinyl acetate copolymers, ethylene-acrylic acid-acrylic ester films, ethylene-ethyl acrylate copolymers, polyethylene, polypropylene, propylene-based copolymers, ethylene-acrylic acid copolymers, and, ethylene-(meth)acrylic acid copolymers, ionomer resins such as ethylene-(meth)acrylic acid-(meth)acrylic ester copolymers crosslinked and the like with metal ions. The base film may be prepared from a mixture or a copolymer of these resins or may be a laminate of these resins.

In particular, the base film is preferably made of a propylene-based copolymer. It is possible by using a propylene-based copolymer to reduce the amount of the debris generated during semiconductor wafer cutting. The propylene-based copolymer is, for example, a random copolymer of propylene with other components, a block copolymer of propylene with other components, or an alternating copolymer of propylene with other components. Examples of the other components include α-olefins such as ethylene, 1-butene, 1-pentene, 1-hexene and 1-heptene, copolymers of at least two or more α-olefins, styrene-diene copolymers and the like. 1-Butene is particularly preferable among them.

The propylene-based copolymer may be prepared, for example, by solution polymerization method, bulk polymerization method, gas-phase polymerization method, stepwise polymerization method or the like, but preferable is a stepwise polymerization method in at least two stages, wherein a propylene homopolymer or a random copolymer of propylene with small amounts of ethylene and/or α-olefin is prepared in the first stage and an α-olefinic homopolymer or a random copolymer of propylene with small amounts of ethylene and/or α-olefin is prepared in the second and later stages.

The base film is preferably finished antistatically. It is possible by the antistatic treatment to prevent static electrification during separation of the semi-cured adhesive layer. Examples of the antistatic treatments include (1) those by blending an antistatic agent to the composition constituting the base film, (2) those by coating an antistatic agent on the cohesive layer-sided surface of the base film, and (3) those by corona discharge. The antistatic agent is, for example, a quaternary amine salt monomer.

Examples of the quaternary amine salt monomers include quaternized dimethylaminoethyl(meth)acrylate chloride salts, quaternized diethylaminoethyl(meth)acrylate chloride salts, quaternized methylethylaminoethyl(meth)acrylate chloride salts, quaternized p-dimethylaminostyrene chloride salts and quaternized p-diethylamino styrene chloride salts, and quaternized dimethylaminoethyl methacrylate chloride salts are preferable.

Cohesive Layer

The cohesive layer is formed by applying a cohesive on a base film. The cohesive constituting the cohesive layer contains a (meth)acrylate ester copolymer, an ultraviolet polymerizable compound, a multifunctional isocyanate curing agent and a photopolymerization initiator.

(Meth)acrylate Ester Copolymer

The (meth)acrylic ester copolymer is a copolymer only of (meth)acrylic ester monomers or a copolymer of (meth) acrylic ester monomers with vinyl compound monomers.

Examples of the (meth)acrylic ester monomers include butyl(meth)acrylate, 2-butyl(meth)acrylate, t-butyl(meth) acrylate, pentyl(meth)acrylate, octyl(meth)acrylate, 2-ethylhexyl(meth)acrylate, nonyl(meth)acrylate, decyl(meth)acrylate, lauryl(meth)acrylate, methyl(meth)acrylate, ethyl (meth)acrylate, isopropyl(meth)acrylate, tridecyl(meth) acrylate, myristyl(meth)acrylate, cetyl(meth)acrylate, stearyl (meth)acrylate, cyclohexyl(meth)acrylate, isobornyl(meth) acrylate, dicyclopentanyl(meth)acrylate, benzyl(meth) acrylate, methoxyethyl(meth)acrylate, ethoxyethyl(meth) acrylate, butoxymethyl(meth)acrylate, ethoxy-n-propyl (meth)acrylate, 2-hydroxyethyl(meth)acrylate, 2-hydroxypropyl(meth)acrylate, and 4-hydroxybutyl(meth) acrylate.

Examples of the vinyl compound monomers include monomers containing one or more functional groups selected from the functional groups consisting of carboxyl, epoxy, amide, amino, methylol, sulfonic acid, sulfamic acid and phosphoric/phosphorous acid ester groups.

Examples of the monomers having a carboxyl group include (meth)acrylic acid, crotonic acid, maleic acid, maleic anhydride, itaconic acid, fumaric acid, acrylamido N-glycolic acid, cinnamic acid and the like.

Examples of the monomers having an epoxy group include allyl glycidyl ether and (meth)acrylic acid glycidyl ether.

The amide group-containing monomer is, for example, (meth)acrylamide.

The amino group-containing monomer is, for example, N,N-dimethylaminoethyl(meth)acrylate.

The methylol group-containing monomer is, for example, N-methylolacrylamide.

The (meth)acrylic ester copolymer is prepared, for example, by emulsion polymerization or solution polymerization.

Ultraviolet Polymerizable Compound

Examples of the ultraviolet polymerizable compounds include trimethylolpropane triacrylate, tetramethylolmethane tetraacrylate, pentaerythritol triacrylate, pentaerythritol tetraacrylate, dipentaerythritol monohydroxy pentaacrylate, dipentaerythritol hexaacrylate, 1,4-butylene glycol diacrylate, 1,6-hexanediol diacrylate, polyethylene glycol diacrylate, cyanuric acid triethyl acrylate, commercially available oligoester acrylates and the like.

In addition to the acrylate-based compounds above, urethane acrylate oligomers may be used as the ultraviolet polymerizable compounds. The urethane acrylate oligomers are obtained in reaction of a terminal isocyanate-containing urethane prepolymer, which is obtained in reaction of a polyester- or polyether-type polyol compound with a polyvalent isocyanate compound (such as 2,4-tolylene diisocyanate, 2,6-tolylene diisocyanate, 1,3-xylene diisocyanate, 1,4-xylene diisocyanate, diphenylmethane 4,4-diisocyanate, trimethylhexamethylene diisocyanate, hexamethylene diisocyanate, or isophorone diisocyanate), with a hydroxy group-containing (meth)acrylate (such as 2-hydroxyethyl(meth)acrylate, 2-hydroxypropyl(meth)acrylate, polyethylene glycol(meth)acrylate, pentaerythritol triacrylate, glycidol di(meth)acrylate, or dipentaerythritol monohydroxy pentaacrylate).

Urethane acrylate oligomers having 4 or more vinyl groups are preferable as the ultraviolet polymerizable compounds, because they permit sufficient curing of the UV-curing adhesive by irradiation with UV ray and easy separation between the cohesive sheet and the semi-cured adhesive layer, thus leading to favorable pickup efficiency.

The amount of the ultraviolet polymerizable compound blended is preferably 5 parts or more by mass and 200 parts or less by mass with respect to 100 parts by mass of the (meth) acrylate ester copolymer. When the blending amount of the ultraviolet polymerizable compound is too low, the semi-cured adhesive layer may become less separable from the cohesive sheet after radiation-ray irradiation, causing a problem in pickup efficiency of the semiconductor chips. Alternatively when the blending amount of the ultraviolet polymerizable compound is too high, there may be more pickup failure caused by migration of the cohesive during dicing. In addition, because the semi-cured adhesive layer may be contaminated by microscopic deposition of the reaction residue, there may be more frequent adhesion failure when semiconductor chips carrying a semi-cured adhesive layer formed thereon is bonded to a lead frame and heated.

Multifunctional Isocyanate Curing Agent

The multifunctional isocyanate curing agent is a compound having two or more isocyanate groups and examples thereof include aromatic polyisocyanates, aliphatic polyisocyanates and cycloaliphatic polyisocyanates.

The aromatic polyisocyanates include 1,3-phenylene diisocyanate, 4,4'-diphenyl diisocyanate, 1,4-phenylene diisocyanate, 4,4'-diphenylmethane diisocyanate, 2,4-tolylene diisocyanate, 2,6-tolylene diisocyanate, 4,4'-toluidine diisocyanate, 2,4,6-triisocyanatotoluene, 1,3,5-triisocyanatobenzene, dianididine diisocyanate, 4 4'-diphenylether diisocyanate, 4,4',4"-triphenylmethane triisocyanate, ω,ω'-diisocyanato-1,3-dimethylbenzene, ω,ω'-diisocyanato-1,4-dimethylbenzene, ω,ω'-diisocyanato-1,4-diethylbenzene, 1,4-tetramethylxylylene diisocyanate, and 1,3-tetramethylxylylene diisocyanate.

The aliphatic polyisocyanates include trimethylene diisocyanate, tetramethylene diisocyanate, hexamethylene diisocyanate, pentamethylene diisocyanate, 1,2-propylene diisocyanate, 2,3-butylene diisocyanate, 1,3-butylene diisocyanate, dodecamethylene diisocyanate, and 2,4,4-trimethylhexamethylene diisocyanate.

The cycloaliphatic polyisocyanates include 3-isocyanatomethyl-3,5,5-trimethylcyclohexyl isocyanate, 1,3-cyclopentane diisocyanate, 1,3-cyclohexane diisocyanate, 1,4-cyclohexane diisocyanate, methyl-2,4-cyclohexane diisocyanate, methyl-2,6-cyclohexane diisocyanate, 4,4'-methylene bis(cyclohexyl isocyanate), and 1,4-bis(isocyanatomethyl)cyclohexane.

Among the polyisocyanates described above, 1,3-phenylene diisocyanate, 4,4'-diphenyl diisocyanate, 1,4-phenylene diisocyanate, 4,4'-diphenylmethane diisocyanate, 2,4-tolylene diisocyanate, 2,6-tolylene diisocyanate, 4,4'-toluidine diisocyanate, and hexamethylene diisocyanate are preferable.

The blending rate of the multifunctional isocyanate curing agent is preferably 0.5 part or more by mass and 20 parts or less by mass with respect to 100 parts by mass of the (meth) acrylate ester copolymer. More preferably, the lower limit is 1.0 part or more by mass and the upper limit is 10 parts or less by mass. When the multifunctional isocyanate curing agent is contained in an amount of 0.5 part or more by mass, it is possible to reduce pickup failure because the adhesive power is not excessively high. Alternatively when the content of the multifunctional isocyanate curing agent is 20 part or less by mass, the semiconductor chip-holding efficiency is preserved during dicing, because the adhesion strength is not excessively low.

Photopolymerization Initiator

The photopolymerization initiator is a compound that has a weight loss rate of 10% of the mass before heating (mass of the photopolymerization initiator at 25° C.) at a temperature of 250° C. or higher when heated from a temperature of 23° C. to 500° C. at a heating rate of 10° C./minute. Such photopolymerization initiators include ethanone, 1-[9-ethyl-6-(2-methylbenzoyl)-9H-carbazol-3-yl]-, 1-(O-acetyloxime) (product name: IRGACURE OXE02, produced by BASF Japan Ltd.), 2,4,6-trimethylbenzoyl-diphenyl-phosphine oxide (product name: LUCIRIN TPO, produced by BASF Japan Ltd.), and 2-hydroxy-1-{4-[4-(2-hydroxy-2-methyl-propionyl)-benzyl]-phenyl}-2-methyl-propan-1-one (product name: IRGACURE 127, produced by BASF Japan Ltd.), 2-benzyl-2-dimethylamino-1-(4-morpholinophenyl)-butanone-1 (product name: IRGACURE 369, produced by BASF Japan Ltd.), 2-dimethylamino-2-(4-methyl-benzyl)-1-(4-morpholin-4-yl-phenyl)-butan-1-one (product name: IRGACURE 379, produced by BASF JapanLtd.), bis(2,4,6-trimethylbenzoyl)-phenylphosphine oxide (product name: IRGACURE 819, produced by BASF Japan Ltd.) and the like. In particular, those showing the 10% weight loss rate at a temperature of 270° C. or higher, such as ethanone, 1-[9-ethyl-6-(2-methyl benzoyl)-9H-carbazol-3-yl]-, 1-(O-acetyloxime) (product name: IRGACURE OXE02, produced by BASF Japan Ltd.), 2,4,6-trimethylbenzoyl-diphenyl-phosphine oxide (product name: LUCIRIN TPO, produced by BASF Japan Ltd.), and 2-hydroxy-1-{4-[4-(2-hydroxy-2-methyl-propionyl)-benzyl]-phenyl}-2-methyl-propan-1-one (product name IRGACURE 127, produced by BASF Japan Ltd.) are preferable. Because such a photopolymerization initiator shows the 10% weight loss rate at a temperature of 250° C. or higher, it is possible to suppress the adhesion failure between the lead frame and the semi-cured adhesive layer, when the chips carrying a semi-cured adhesive layer obtained after dicing and pickup steps are bonded to a lead frame, molded with a sealing resin and heated at around 260° C.

The blending amount of the photopolymerization initiator is preferably 0.1 part or more by mass and 20 part or less by mass with respect to 100 parts by mass of the (meth)acrylate ester polymer. When the blending amount is excessively low, the semi-cured adhesive layer may become less separable from the cohesive sheet after radiation-ray irradiation, leading to reduction of the pickup efficiency of semiconductor chips. Alternatively when it is excessively high, it is not possible to prevent contamination of the semi-cured adhesive layer caused by bleeding out of the cohesive layer surface, thus leading to easier adhesion failure when semiconductor chips carrying a semi-cured adhesive layer are mounted on a lead frame and heated.

Additives such as releasing agents (e.g. of silicone polymers), softeners, aging inhibitors, fillers, ultraviolet absorbents, and photostabilizers may be added to the cohesive, in the range that does not affect other raw materials.

The thickness of the cohesive layer is preferably 3 μm or more and 100 μm, particularly preferably, 5 μm or more and 20 μm or less.

(3) Dicing Step

The dicing step is a step of dicing the silicon wafers together with the semi-cured adhesive layer into semiconductor chips, by rotating a dicing blade containing diamond polishing powders at high speed in a dicing apparatus. Dicing apparatuses and dicing conditions commonly used can be employed.

(4) Pick-Up Step

The pick-up step is a step of separating semiconductor chips carrying the semi-cured adhesive layer from the cohesive layer by reducing the adhesive power between the cohesive layer and the semi-cured adhesive layer by irradiation of the cohesive layer of cohesive sheet with radiation ray. The radiation ray is not particularly limited in its kind and any known radiation ray may be used. When the adhesive power is reduced by irradiation with ultraviolet ray, the ultraviolet ray sources used include black light, low-pressure mercury lamps, high-pressure mercury lamps, ultrahigh-pressure mercury lamps, metal halide lamps, excimer lamps and the like.

The amount of the ultraviolet irradiation is not particularly limited and can be selected appropriately according to the design of the cohesive, but generally, preferably 5 mJ/cm$^2$ or more and less than 1000 mJ/cm$^2$. Irradiation in an insufficient amount leads to insufficient curing of the cohesive and thus to reduction of the pickup efficiency, while irradiation in an excessive amount leads to elongation of the time for UV irradiation and thus to reduction of processability.

When semiconductor chips carrying the semi-cured adhesive layer are separated, generally a pick-up apparatus or a die-bonding apparatus is used.

According to the method for manufacturing electronic parts in this embodiment, which employs the cohesive sheet described above, it is possible to reduce contamination of the semi-cured adhesive layer, consequently to suppress adhesion failure for example between chips and lead frame, to separate the semiconductor chips carrying a semi-cured adhesive layer easily from the cohesive sheet in the (4) pick-up step, and to reduce the frequency of chip flying in the (3) dicing step.

EXAMPLES

Various cohesive sheets used in Examples and Comparative Examples were prepared from the base film and the cohesive layers of cohesive agent shown below.

Base Film

The base film used in all Examples and Comparative Examples was a propylene-based copolymer film (part number: X500F, produced by SunAllomer Ltd.). The MFR (melt flow rate) of the film was 7.5 g/10 minute; the density was 0.89 g/cm$^3$; and the thickness was 80 μm.

Cohesive Layers

The cohesive layers were prepared by using a cohesive containing a (meth)acrylic ester copolymer, an ultraviolet polymerizable compound, a multifunctional isocyanate curing agent, and a photopolymerization initiator described below.

(Meth)acrylate Ester Copolymers

A-1: SK Dyne 1496 from Soken Chemical & Engineering Co., Ltd.; a copolymer of 96% 2-ethylhexyl acrylate and 4% 2-hydroxyethyl acrylate that was obtained by solution polymerization A-2: acrylic rubber AR53L from Zeon Corp.; a copolymer of 40% ethyl acrylate, 23% butyl acrylate, and 37% methoxyethyl acrylate that was obtained by emulsion polymerization Ultraviolet Polymerizable Compounds B-1: UN-3320HS from Negami Chemical Industrial Co., Ltd.; a compound having a vinyl group number of 15, which was obtained in reaction of isophorone diisocyanate trimer with dipentaerythritol pentaacrylate B-2: A-TMPT from Shin-Nakamura Chemical Co., Ltd.; trimethylolpropane triacrylate, having a vinyl group number of 3

Multifunctional Isocyanate Curing Agent

C-1: Coronate L-45E from Nippon Polyurethane Industry Co., Ltd.; 2,4-tolylene diisocyanate trimethylolpropane adduct Photopolymerization Initiators D-1: IRGACURE OXE02, from BASF Japan Ltd.; ethanone, 1-[9-ethyl-6-(2-methylbenzoyl)-9H-carbazol-3-yl]-, 1-(O-acetyloxime), temperature at the 10% weight loss rate: 320° C.

D-2: LUCIRIN TPO from BASF Japan Ltd.; 2,4,6-trimethylbenzoyl-diphenyl-phosphine oxide, temperature at the 10% weight loss rate: 270° C.

D-3: IRGACURE 127 from BASF Japan Ltd.; 2-hydroxy-1-{4-[4-(2-hydroxy-2-methyl-propionyl)-benzyl]-phenyl}-2-methyl-propan-1-one, temperature at the 10% weight loss rate: 275° C.

D-4: IRGACURE 379 from BASF Japan Ltd.; 2-dimethylamino-2-(4-methyl-benzyl)-1-(4-morpholin-4-yl-phenyl)-butan-1-one, temperature at the 10% weight loss rate: 265° C.

D-5: IRGACURE 651 from BASF Japan Ltd.; benzyl dimethyl ketal, temperature at the 10% weight loss rate: 185° C.

Method of Measuring the Weight Loss Rate of Photopolymerization Initiators

The weight loss rate of a photopolymerization initiator was determined in the following manner: the mass of the photopolymerization initiator (mass before heating) was determined in an environment at 25° C.: the photopolymerization initiator was then heated from 23° C. to 500° C. at a heating rate of 10° C./min in a simultaneous thermogravimetric and differential thermal analyzer [simultaneous TG/DTA analyzer, TG/DTA220 produced by Seiko] and the mass of the photopolymerization initiator at each temperature was determined (mass after heating); and the weight loss rate was calculated according to the Formula below. The temperature at which each photopolymerization initiator shows the 10% weight loss rate was determined.

Weight loss rate={(Mass before heating−Mass after heating)/(Mass before heating)}×100(%)

Preparation of Cohesive Sheet

A cohesive was applied on a polyethylene terephthalate separator film to a cohesive layer thickness of 10 μm after drying. The cohesive layer was bonded to on a base film and the laminate was aged at 40° C. for 7 days, to give a cohesive sheet carrying a separator film.

Evaluation of Cohesive Sheet

The chip-holding efficiency, pickup efficiency, and contamination resistance of a cohesive sheet was evaluated after the following steps (1) to (4), i.e. after forming a semi-cured adhesive layer on a silicon wafer, fixing the silicon wafer on a cohesive sheet obtained above, dicing the silicon wafer thereon into semiconductor chips and picking up the semiconductor chips obtained.

(1) Semi-cured adhesive layer-forming step: A pasty adhesive containing an epoxy resin and an acrylate ester as major components was applied by screen printing entirely over the rear face of a silicon wafer with a dimension of 8 inch diameter×0.1 mm thickness carrying a dummy circuit pattern, cured by irradiation with ultraviolet ray at an irradiation light amount of 1000 mJ/cm² and thus converted into a sheet having a thickness of 30 μm.

(2) Fixing step: The semi-cured adhesive layer formed on the rear face of the silicon wafer and a ring frame were fixed, as they are bonded to the cohesive layer of the cohesive sheet.

(3) Dicing Step:

The silicon wafer was diced with a dicing blade into semiconductor chips of 9 mm×9 mm together with the semi-cured adhesive layer. The dicing step was carried out by using the apparatus and under the conditions shown below:

Dicing apparatus: DAD341 manufactured by DISCO Corporation
Dicing blade: NBC-ZH2050-27HEEE manufactured by DISCO Corporation
Shape of dicing blade: external diameter: 55.56 mm, blade width: 35 μm, inner diameter: 19.05 mm
Dicing blade rotational frequency: 40,000 rpm
Dicing blade feed velocity: 50 mm/second
Cut depth into cohesive sheet: 15 μm
Machining water temperature: 25° C.
Amount of machining water: 1.0 L/min (4) Pick-up Step:

After irradiation with ultraviolet ray from a high-pressure mercury lamp at an intensity of 150 mJ/m², the chips carrying the semi-cured adhesive layer were picked up from the cohesive layer. The pick-up step was carried out by using the apparatus and under the condition described below:

Pickup machine: CAP-30011 manufactured by Canon Machinery
Shape of needle pin: 250 μmR
Needle pin push-up height: 0.5 mm
Expansion: 8 mm Chip-Holding Efficiency The chip-holding efficiency was evaluated by determining the rate of the semiconductor chips that remained held by the cohesive sheet even after the dicing step.

◎ (favorable): chip flying rate: less than 5%
○ (good): chip flying rate: 5% or more and less than 10%
x (unfavorable): chip flying rate: 10% or more Pick-up Efficiency The pick-up efficiency was evaluated by counting the rate of the chips that could be picked up in the pick-up step.

◎ (favorable): 95% or more of the chips were picked up.
○ (good): 80% or more and less than 95% of the chips were picked up.
x (unfavorable): less than 80% of the chips were picked up.

Contamination Resistance

For evaluation of the contamination resistance, the amount of the out gas from the semi-cured adhesive layer was measured. A semi-cured adhesive layer was bonded to the cohesive layer of the cohesive sheet; after storage for two weeks, the composite was irradiated with ultraviolet ray at an intensity of 500 mJ/cm² from a high-pressure mercury lamp; and the semi-cured adhesive layer was peeled off from the cohesive sheet. The amount of the out gas derived from the photopolymerization initiator generated from the semi-cured adhesive layer separated was evaluated. The amount of the out gas was determined by placing 3 mg of the semi-cured adhesive layer separated in a vial, which was tightly sealed for measurement of out gas, and injecting the gas therein into a GC-MS system using a headspace sampler after storage at 250° C. for 30 minutes.

◎ (favorable): amount of photopolymerization initiator-derived out gas: less than 200 μg/g.
○ (good): amount of photopolymerization initiator-derived out gas: 200 μg/g or more and less than 800 μg/g
x (unfavorable): amount of photopolymerization initiator-derived out gas: 800 μg/g or more.

The composition of the cohesives that constitute the cohesive layers and evaluation results are summarized in Table 1. In Table 1, the values showing the composition of the cohesive that constitutes the cohesive layer are those expressed by parts by mass.

TABLE 1

|  |  |  | Example | | | | | | | | | |
|---|---|---|---|---|---|---|---|---|---|---|---|---|
|  |  |  | 1 | 2 | 3 | 4 | 5 | 6 | 7 | 8 | 9 | 10 |
| Cohesive layer | (Meth) acrylate ester copolymer | A-1 | 100 |  | 100 | 100 | 100 | 100 | 100 | 100 | 100 | 100 |
|  |  | A-2 |  | 100 |  |  |  |  |  |  |  |  |
|  | Ultraviolet polymerizable compound | B-1 | 50 | 50 |  | 5 | 200 | 3 | 250 | 50 | 50 | 50 |
|  |  | B-2 |  |  | 50 |  |  |  |  |  |  |  |
|  | Multifunctional isocyanate curing agent | C-1 | 5 | 5 | 5 | 5 | 5 | 5 | 5 | 0.5 | 20 | 0.1 |
|  | Photopolymerization initiator | D-1 | 1.5 | 1.5 | 1.5 | 1.5 | 1.5 | 1.5 | 1.5 | 1.5 | 1.5 | 1.5 |
|  |  | D-2 |  |  |  |  |  |  |  |  |  |  |
|  |  | D-3 |  |  |  |  |  |  |  |  |  |  |
|  |  | D-4 |  |  |  |  |  |  |  |  |  |  |
|  |  | D-5 |  |  |  |  |  |  |  |  |  |  |
| Evaluation | Chip-holding efficiency |  | ◎ | ◎ | ○ | ◎ | ◎ | ◎ | ◎ | ◎ | ◎ | ◎ |
|  | Pickup efficiency |  | ◎ | ◎ | ○ | ◎ | ◎ | ○ | ○ | ◎ | ◎ | ○ |
|  | Contamination resistance |  | ◎ | ◎ | ◎ | ◎ | ◎ | ◎ | ◎ | ◎ | ◎ | ◎ |
|  | Overall |  | ◎ | ◎ | ○ | ◎ | ◎ | ◎ | ◎ | ◎ | ◎ | ○ |

TABLE 1-continued

|  |  |  | Example 11 | Example 12 | Example 13 | Example 14 | Example 15 | Example 16 | Example 17 | Example 18 | Comparative Example 1 |
|---|---|---|---|---|---|---|---|---|---|---|---|
| Cohesive layer | (Meth)acrylate ester copolymer | A-1 | 100 | 100 | 100 | 100 | 100 | 100 | 100 | 100 | 100 |
|  |  | A-2 |  |  |  |  |  |  |  |  |  |
|  | Ultraviolet polymerizable compound | B-1 | 50 | 50 | 50 | 50 | 50 | 50 | 50 | 50 | 50 |
|  |  | B-2 |  |  |  |  |  |  |  |  |  |
|  | Multifunctional isocyanate curing agent | C-1 | 25 | 5 | 5 | 5 | 5 | 5 | 5 | 5 | 5 |
|  | Photopolymerization initiator | D-1 | 1.5 | 0.1 | 20 | 0.01 | 25 |  |  |  |  |
|  |  | D-2 |  |  |  |  |  | 1.5 |  |  |  |
|  |  | D-3 |  |  |  |  |  |  | 1.5 |  |  |
|  |  | D-4 |  |  |  |  |  |  |  | 1.5 |  |
|  |  | D-5 |  |  |  |  |  |  |  |  | 1.5 |
| Evaluation | Chip-holding efficiency |  | ○ | ◎ | ◎ | ◎ | ◎ | ◎ | ◎ | ◎ | ◎ |
|  | Pickup efficiency |  | ◎ | ◎ | ◎ | ○ | ◎ | ◎ | ◎ | ◎ | ◎ |
|  | Contamination resistance |  | ◎ | ◎ | ◎ | ◎ | ○ | ◎ | ◎ | ○ | × |
|  | Overall |  | ○ | ◎ | ◎ | ◎ | ○ | ◎ | ◎ | ○ | × |

As shown in Table 1, it was possible to improve the contamination resistance of the semi-cured adhesive layer formed on the semiconductor wafer and also to improve the chip-holding and pickup efficiencies, by using a cohesive with a particular composition for the cohesive layer of the cohesive sheet.

The invention claimed is:

1. A method for manufacturing electronic parts, comprising a semi-cured adhesive layer-forming step of forming a semi-cured adhesive layer by coating a pasty adhesive entirely over the rear face of a wafer and curing the pasty adhesive partially by radiation-ray irradiation or heating into the sheet shape, a fixing step of fixing the semi-cured adhesive layer formed on a wafer and a ring frame by bonding them to the cohesive layer of a cohesive sheet, a dicing step of dicing the wafer together with the semi-cured adhesive layer with a dicing blade into semiconductor chips, and a pick-up step of picking up the chips carrying the semi-cured adhesive layer from the cohesive layer of the cohesive sheet after radiation-ray irradiation, wherein:

the cohesive sheet has a base film and a cohesive layer laminated on one face of the base film;

the cohesive constituting the cohesive layer contains a (meth)acrylate ester copolymer, an ultraviolet polymerizable compound, a multifunctional isocyanate curing agent and a photopolymerization initiator; and the temperature of the photopolymerization initiator, at which the weight loss rate thereof, which is calculated by the following equation:

weight loss rate={(mass before heating−mass after heating)/(mass before heating)}×100(%)

(wherein, the mass before heating is the mass of the photopolymerization initiator at 25° C.; the mass after heating is the mass of the photopolymerization initiator at each temperature when it is heated from 23° C. to 500° C. at a heating rate of 10° C./minute) becomes 10%, is 250° C. or higher.

2. The method for manufacturing electronic parts according to claim 1, wherein the photopolymerization initiator is ethanone, 1-[9-ethyl-6-(2-methylbenzoyl)-9H-carbazol-3-yl]-, 1-(O-acetyloxime), 2,4,6-trimethylbenzoyl-diphenyl-phosphine oxide, or 2-hydroxy-1-{4-[4-(2-hydroxy-2-methyl-propionyl)-benzyl]-phenyl}-2-methyl-propan-1-one.

3. The method for manufacturing electronic parts according to claim 1, wherein the cohesive contains a (meth)acrylate ester polymer in an amount of 100 parts by mass, an ultraviolet polymerizable compound in an amount of 5 parts or more by mass and 200 parts or less by mass, a multifunctional isocyanate curing agent in an amount of 0.5 part or more by mass and 20 parts or less by mass and a photopolymerization initiator in an amount of 0.1 part or more by mass and 20 parts or less by mass.

4. The method for manufacturing electronic parts according to claim 1, wherein the pasty adhesive in the semi-cured adhesive layer-forming step contains at least an epoxy resin and/or a (meth)acrylate ester.

5. A cohesive sheet for manufacture of electronic parts, which is used as bonded to the semi-cured adhesive layer formed on the rear face of a wafer, comprising a base film and a cohesive layer laminated on one face of the base film, wherein:

the cohesive constituting the cohesive layer contains a (meth)acrylate ester copolymer, an ultraviolet polymerizable compound, a multifunctional isocyanate curing agent and a photopolymerization initiator; and the temperature of the photopolymerization initiator, at which the weight loss rate thereof, which is calculated by the following equation:

weight loss rate={(mass before heating−mass after heating)/(mass before heating)}×100(%)

(wherein, the mass before heating is the mass of the photopolymerization initiator at 25° C.; the mass after heating is the mass of the photopolymerization initiator at each temperature when it is heated from 23° C. to 500° C. at a heating rate of 10° C./minute) becomes 10%, is 250° C. or higher.

* * * * *